(12) United States Patent
Brunschwiler et al.

(10) Patent No.: US 10,008,474 B2
(45) Date of Patent: Jun. 26, 2018

(54) DENSE ASSEMBLY OF LATERALLY SOLDERED, OVERMOLDED CHIP PACKAGES

(71) Applicant: International Business Machines Corporation, Armonk, NY (US)

(72) Inventors: Thomas J. Brunschwiler, Thalwil (CH); Andreas Christian Doering, Zufikon (CH); Ronald Peter Luijten, Thalwil (CH); Stefano Sergio Oggioni, Milan (IT); Patricia Maria Sagmeister, Adliswil (CH); Martin Leo Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/206,729

(22) Filed: Jul. 11, 2016

(65) Prior Publication Data
US 2018/0012864 A1    Jan. 11, 2018

(51) Int. Cl.
| H01L 29/40 | (2006.01) |
| H01L 25/065 | (2006.01) |
| H01L 23/498 | (2006.01) |
| H01L 23/31 | (2006.01) |
| H01L 23/00 | (2006.01) |
| H01L 23/367 | (2006.01) |

(52) U.S. Cl.
CPC ...... *H01L 25/0655* (2013.01); *H01L 23/3114* (2013.01); *H01L 23/367* (2013.01); *H01L 23/49838* (2013.01); *H01L 24/48* (2013.01); *H01L 2224/48225* (2013.01)

(58) Field of Classification Search
CPC ............... H01L 25/0655; H01L 23/367; H01L 23/3114; H01L 23/49838; H01L 24/48; H01L 2224/48225
USPC ......................................................... 257/773
See application file for complete search history.

(56) References Cited

U.S. PATENT DOCUMENTS

| 8,476,748 B1 | 7/2013 | Darveaux et al. |
| 2005/0006757 A1* | 1/2005 | Rinella ............... B22D 17/007 257/712 |

(Continued)

OTHER PUBLICATIONS

"Wafer Level Stack Die With Flex Tape for IC Packages Such As BGA, QFN, and QFP" an IP.com Prior Art Database Technical Disclosure, IPCOM000241451D, Apr. 29, 2015.

*Primary Examiner* — Long K Tran
(74) *Attorney, Agent, or Firm* — Harrington & Smith

(57) ABSTRACT

Embodiments of the invention are directed to an integrated circuit (IC) package assembly, including: one or more printed circuit boards (PCBs); and a set of chip packages, each including: an overmold; and an IC chip, overmolded in the overmold, and wherein: the chip packages are stacked transversely to an average plane of each of the chip packages, thereby forming a stack wherein a main surface of one of the chip packages faces a main surface of another one of the chip packages; and each of the chip packages is laterally soldered to one or more of said one or more PCBs and arranged transversally to each of said one or more PCBs, whereby an average plane of each of said one or more PCBs extends transversely to the average plane of each of the chip packages of the stack. Further embodiments are directed to related devices and fabrication methods.

24 Claims, 7 Drawing Sheets

(56) References Cited

U.S. PATENT DOCUMENTS

| | | | |
|---|---|---|---|
| 2007/0035003 A1* | 2/2007 | Garth | H01L 23/49838 257/686 |
| 2007/0290376 A1 | 12/2007 | Zhao et al. | |
| 2008/0169543 A1* | 7/2008 | Chiang | H01L 25/105 257/685 |
| 2011/0204494 A1* | 8/2011 | Chi | H01L 21/56 257/659 |
| 2012/0319255 A1 | 12/2012 | Zhong et al. | |
| 2013/0105966 A1 | 5/2013 | Kelkar et al. | |
| 2015/0004813 A1 | 1/2015 | Heppner et al. | |

* cited by examiner

DENSE ASSEMBLY OF LATERALLY SOLDERED, OVERMOLDED CHIP PACKAGES

BACKGROUND

The invention relates in general to the field of integrated circuit packages and assemblies thereof, as well as methods of fabrication thereof. It is, in particular, directed to dense assembly, or stack, of overmolded, integrated circuit chip packages, where the packages of the stack are laterally soldered (e.g., edge soldered) to a transverse printed circuit board.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Printed circuit boards are routinely used to support and electrically connect various electronic components. PCBs use conductive tracks and contact pads, which are typically etched from a copper sheet laminated onto a non-conductive substrate (typically a FR-4 glass epoxy). PCBs can be single sided or double sided. One also knows multi-layer PCBs, which allow for higher component density.

With ever higher integration and higher speed of microprocessors and memory, more compact packaging assemblies are desired. High density interconnect boards have been proposed, which comprise blind and/or buried vias and offer higher circuitry density than traditional circuit boards. Beside, assemblies of PCBs have been proposed, allowing PCBs (with electronic components mounted thereon) to be placed close to each other in vertical stacks. More generally, PCBs may be packed in horizontal or vertical arrangements, using sockets to maintain and electrically connect them to, e.g., a base board.

SUMMARY

This section is intended to include examples and is not intended to be limiting.

According to an embodiment, the present invention is embodied as an integrated circuit (IC) package assembly, comprising: one or more printed circuit boards (PCBs); and a set of chip packages, each comprising: an overmold; and an IC chip, overmolded in the overmold, and wherein: the chip packages are stacked transversely to an average plane of each of the chip packages, thereby forming a stack wherein a main surface of one of the chip packages faces a main surface of another one of the chip packages of the stack; and each of the chip packages is laterally soldered to one or more of said one or more PCBs and arranged transversally to each of said one or more PCBs, whereby an average plane of each of said one or more PCBs extends transversely to the average plane of each of the chip packages of the stack.

Further embodiments are directed to related devices and fabrication methods.

Devices and methods embodying the present invention will now be described, by way of non-limiting examples, and in reference to the accompanying drawings.

Figure 1A:
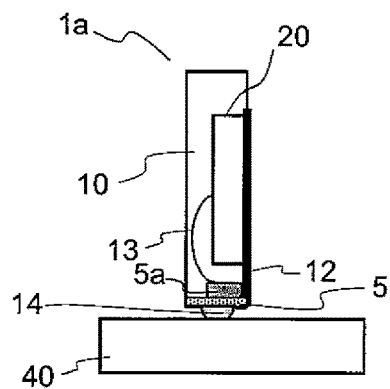
FIGS. 1A-1E show 2D cross-sectional views of various chip packages, laterally soldered to a transverse PCB, as involved in IC package assemblies according to embodiments of the invention.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments herein describe techniques for dense assembly of laterally soldered, overmolded chip packages. The following description is structured as follows. First, general embodiments and high-level variants are described (sect. 1). The next section addresses more specific embodiments and technical implementation details (sect. 2).

1. General Embodiments and High-level Variants

Referring generally to FIGS. 1-9 (and in particular to FIG. 9), an exemplary aspect of the invention is first described, which concerns an integrated circuit package assembly 100, or IC package assembly.

The IC package assembly basically comprises one or more printed circuit boards 40, 50, 50a, or PCBs, and a set of chip packages 1a-1e. Each chip package comprises an integrated circuit chip 20, or IC chip, which is overmolded in an overmold 10. The chip packages 1a-1e are stacked transversely to their average planes, i.e., the stacking direction is transverse (e.g., perpendicular) to the average plane of each chip package. The chip packages accordingly form a stack, in which a main surface MS of one of the chip packages faces a main surface MS of another one of the chip packages of the stack, see FIGS. 2-6, together with FIG. 9. A "main surface" is one of the two largest surfaces of a chip package, assimilating the later as a parallelepiped, as further discussed below.

In addition, each of the chip packages 1a-1e is laterally soldered 14 to a PCB 40, 50, 50a. Accordingly, the packages 1a-1e are arranged transversally to a PCB 40, 50, 50a to which they are soldered. I.e., the average plane of the PCB (or of each of the transverse PCBs involved) extends transversely to the average plane of each of the chip packages of the stack. The average plane of the transverse PCB(s) extends, in principle, parallel to the stacking direction.

The above structure allows particularly dense assemblies of overmolded packages to be obtained, as illustrated in FIGS. 1-6, and as further discussed below in detail. Indeed, not only the overmolded chip packages can be directly connected to a transverse PCB (rather than being indirectly connected via respective carrier boards, such that no carrier PCB need be involved in the stack), but, in addition, the packages of the stack are laterally soldered, instead of being stacked flat on a single PCB.

Figure 4:
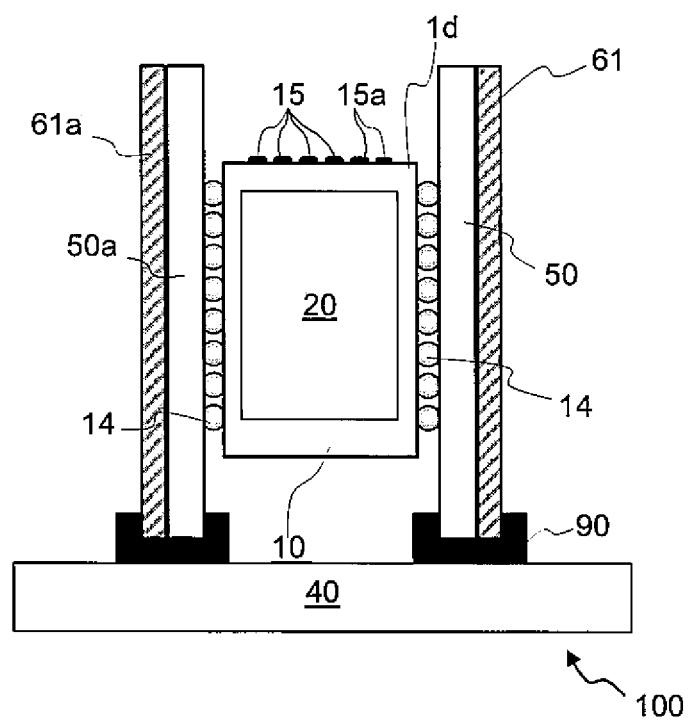
FIG. 4 is a front view of FIG. 3.
Figure 6:
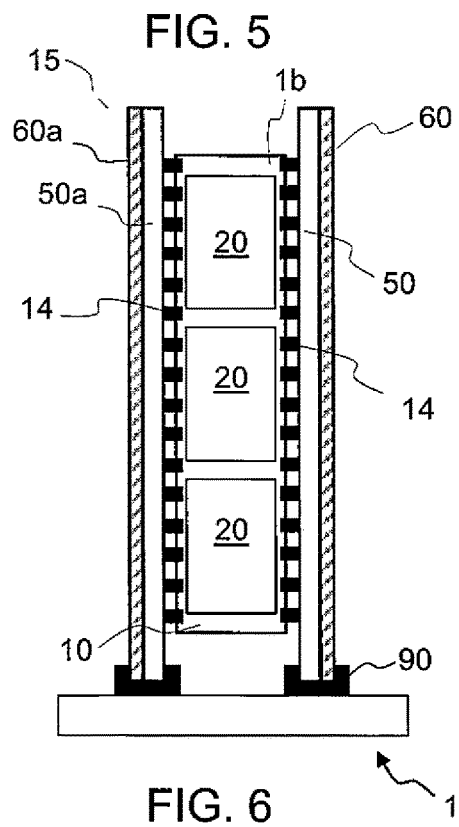
FIG. 6 is a front view of FIG. 5.

The lateral connection of the packages circumvents the need for sockets to connect them. Sockets 90 may nevertheless be used, in embodiments, to connect, e.g., a side board to a base board, as depicted in FIGS. 4 and 6. As it can be realized, the dimensions of the sockets 90 inherently limit the density that can be achieved by piling up PCBs or chip packages. Instead, using lateral interconnects (e.g., solders) as proposed herein allows chip packages to be brought closer to each other and thereby denser IC package assemblies to be obtained. If necessary, mechanical reinforcement can be contemplated to improve the mechanical stability of the IC package assemblies. However, mechanical reinforcement may be provided by a suitably shaped heat dissipation structure 60, 60a, as discussed later in reference to FIG. 2.

Figure 2A:
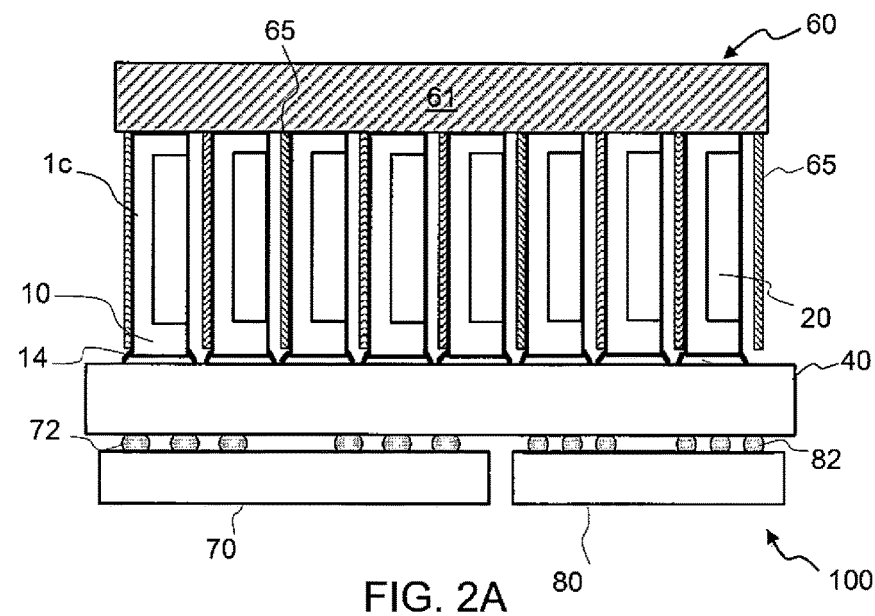
FIGS. 2A-2C show side views of IC package assemblies of chip packages such as depicted in FIGS. 1A-1E, according to various embodiments.
Figure 5:
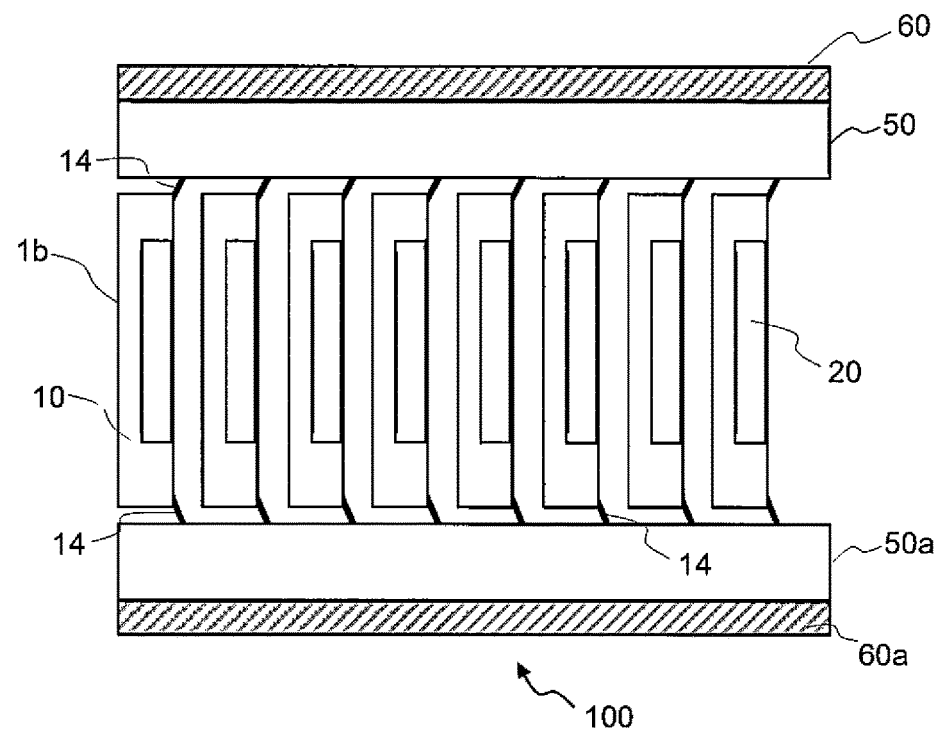

Although each package is preferably soldered to a same PCB, some of the packages may be soldered to distinct PCBs, it being noted that the rectangular shape of the basis packages 1a-1e allows packages of the stack to be laterally soldered to up to four distinct, surrounding PCBs, each arranged transversely with respect to the stack (not shown). Namely, each of two or more of the chip packages may be laterally soldered to a same (transverse) PCB, as assumed in the embodiments of FIGS. 2A-2C. In variants, the packages 1a-1e may be soldered, each, to a pair of transverse PCBs (and to each of them), as illustrated in FIGS. 3, 5 and 6. Yet, a triplet or a quadruplet of PCBs (arranged so as to surround the stack) may be involved. In other variants (not shown), a first subset of the packages may be laterally soldered to a first (transverse) PCB only, while a second subset may be only soldered to a second PCB, etc.

One or more chips, e.g., memory chips and processor chips, can be used to form the chip packages (i.e., one or more chips may be overmolded in such packages), according to embodiments. For instance, microprocessor chips may be connected to memory chips in a same or a neighboring overmolded packages. More generally, any kind of IC chip can be contemplated. One or more of the chip packages may actually comprise a chip stack, where the stack is, as a whole, overmolded, so as to form a chip package.

For example, in the embodiment of FIG. 6, one or more of the chip packages 1b comprise three IC chips 20 that are, each, overmolded in a respective overmold 10. The overmolded chips may be of a same type, or of different types, e.g., a memory chip and a microprocessor chip may for instance be overmolded in a same package.

In all cases, the overmolded chip packages 1a-1e are laterally soldered 14 to a same board 40, 50, 50a, e.g., via lateral conductors 5-8, which may be formed along a lateral edge of the chip packages or directly on a lower, lateral surface thereof.

The transverse PCBs may comprise a baseboard 40 (as in FIGS. 2, 4), or a sideboard (daughterboard) 50, 50a (FIGS. 3, 4). Note that the baseboard 40 of FIGS. 1, 2 plays basically the same role as the sideboards 50, 50a of FIG. 3 or 4. The baseboard 40 of FIG. 3 or 4 differs from the baseboard 40 of FIGS. 1, 2 in that two side boards 50, 50a are mounted thereon, via sockets 90. In addition, the base board 40 of FIG. 2A is a double side board, which comprises additional components 70, 80 mounted on the opposite side and electrically connected via solder balls 72, 82. These additional components 70, 80 may for instance comprise a memory controller and an interface controller. Additional components such as FPGAs may further be involved, if necessary.

Overmolding is a molding process that typically uses transfer or compression molding. In the present context, the overmold provides mechanical stability of the overmolded IC chips, while allowing electrical connections and wiring thereto, as necessary to connect the chips to the transverse PCBs. Preferably, the chip packages 1a-1e are fabricated using a mold that allows previously fabricated parts (the IC chip 20, connection parts 5, wires 12, 13, etc.) to be reinserted to allow a new plastic layer to form around and/or above the inserted parts. The result is typically an encapsulated IC chip 20, wherein a main surface of the chip 20 is at least partly (and typically mostly, or essentially) covered by a layer of encapsulation material 10. Examples of materials 10 for the overmold include composite materials that comprise an epoxy matrix with filler particles such as silica spheres. Alumina particles may be used as a filler material, in addition or in place of silica, to improve thermal conductivity. The dimensions of a chip package are preferably smaller than 1.2 times the chip dimensions (lateral dimensions as well as thickness), as in chip scale packages, see below.

The resulting package will preferably comprises electrical conductors 12, 13 already formed thereon and/or therein, as per their fabrication process. As for example illustrated in FIGS. 1A-1E and 9, the chip packages 1a-1e may comprises wires 12, 13 that electrically connect lateral conductors 5-8 of the packages to their respective IC chips 20. In particular, said wires may. comprise wire portions 12 that extend on a main surfaces MS of the chip packages. In addition, and as illustrated in FIGS. 1A-1C, and 9, said wires may comprise wire portions 13 that are encapsulated in the overmold material 10. This way, some of the lateral conductors 5, 5a, 6, 6a, 7, 8 may be connected to outer wires 12, while others connect to encapsulated conductors 13. Moreover, trough vias (not shown) may be provided in the overmold, in addition to wire portions 12, 13, to contact the chip 20.

The wires 12 may notably extend on an external surface of the overmold 10 or on a main surface MS of the package, e.g., on the front side. For example, electrical traces 12 may be patterned on outer surfaces of the package (as assumed in FIG. 9). Wiring layers 12 may be added by, e.g., electroforming, to provide the fan-out of the electrical interconnects. Thanks to the conductors 12, 13, the IC chips 20 can be connected directly to the transverse PCBs, such that no intermediate (carrier) PCB need be involved in the stack of chip packages.

The packages 1a-1e may form, each, a specific chip scale package or CSP, allowing transversal side or edge electrical connection. The general concept of CSP is known per se. In the present context, a package 1a-1e will, as a whole, preferably span a limited area, e.g., that is not greater than 1.2 times that of the IC chip the appended (it being reminded that the appended drawings are not to scale). In particular, a CSP as formed by the present overmolded chip packages may form a customized flat no-leads package, also known as micro leadframe (MLF) or small-outline no leads (SON). Example of flat no-leads packages are the so-called quad-flat no-leads (QFN) or dual-flat no-leads (DFN) packages. Such packages make it possible to electrically connect an IC chip to external boards, without involving through-holes. In the present context, however, the packages need be designed so as to allow a lateral soldering, to connect them to a transverse PCB, instead of a flat soldering.

Figure 9:
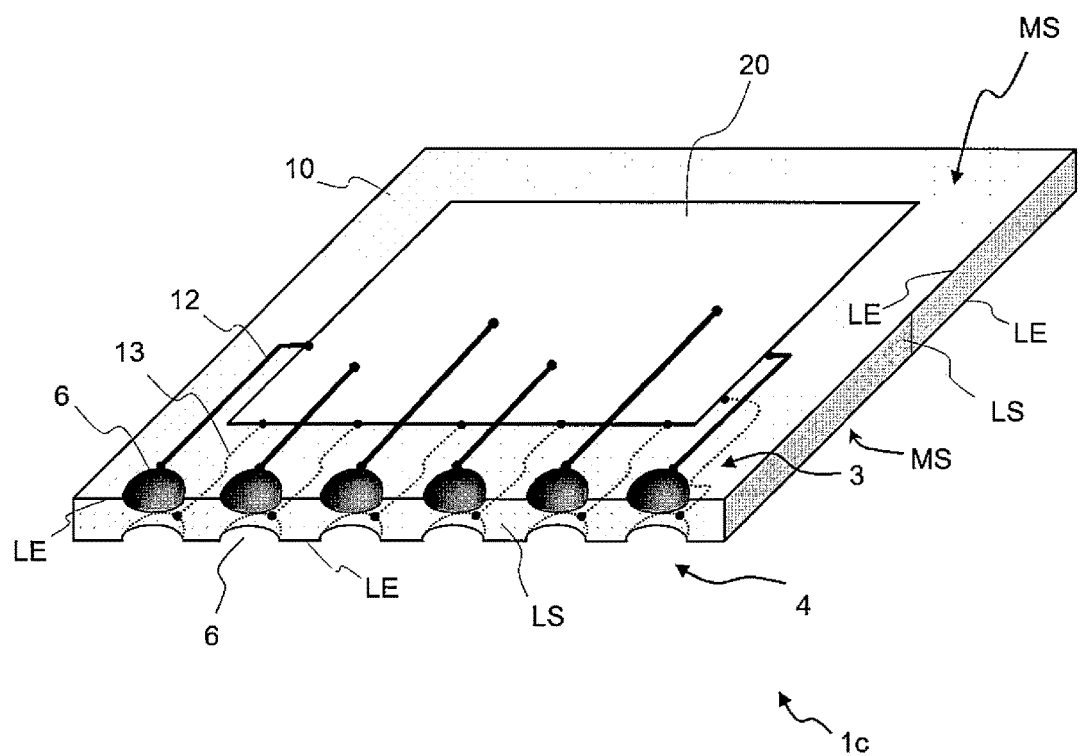
FIG. 9 is a 3D view of an example of a chip package, showing locations of blind holes for fabricating two rows of solder pads on opposite edges of the package, as involved in embodiments of the present IC package assemblies.

In embodiments, each of the chip packages 1a-1e of the IC package assembly 100 comprises two opposite main surfaces MS, each delimited by lateral edges LE, and lateral surfaces LS, where each lateral surface meets each of the two main surfaces MS at one of the lateral edges LE, as illustrated in FIG. 9.

For example, assuming that the packages are essentially rectangular and planar objects (which is typically the case in practice), each package can be regarded as a rectangular parallelepiped, as in FIG. 9. A package accordingly exhibits two main surfaces MS (the largest surfaces, essentially parallel). Each of the main surfaces is delimited by four lateral edges LE and four lateral surfaces LS. Each of the four lateral surfaces meets the main surfaces MS at a lateral edge LE. The lateral surfaces LS geometrically differ from the main surfaces MS (they are much smaller, see FIG. 9). A lateral edge LE can be a longitudinal edge (extending along the longest side of the main surface) or a latitudinal edge (extending along the shortest side of the main surface) of the overmolded chip package.

Of course, real packages may have shapes that slightly depart from ideal rectangular boxes'. However, an ideal rectangular parallelepiped (box) may be regarded as a bounding box for a real package and the ideal main and lateral surfaces, and lateral edges, as approximations to the real surfaces and edges of the real PCBs.

Interestingly, and as depicted in FIGS. 1-6 and 9, lateral electrical conductors 5-8 are preferably formed along one (or more) of the lateral edges LE of such packages 1a-1e, to ease the connection to the transverse PCB(s). They are preferably formed along the longest side(s) of the chip packages to allow larger connection densities. The lateral conductors 5-8 may be primarily formed on one of the main surfaces MS and/or on one of the lateral surfaces LS. Still, they extend along a lateral edge, e.g., in the vicinity thereof or directly thereat, to ease the lateral soldering.

They may for example be formed as solder pads, primarily formed on a main surface of the overmolded package 1a-1e, close to or directly at a lateral edge LE, as discussed below. In variants, the lateral conductors may be primarily formed as bus lines (e.g., laser bus lines) or (exposed) through mold vias, on a lateral surface of the packages, as discussed later in details. A bus line formed on a lateral surface LS may be "interrupted", e.g., by laser ablation, so as to form a row of pad-like conductors on a lateral surface. More generally, the lateral electrical conductors may be any kind of electrical contact, or connector, suitable for subsequent soldering, i.e., to enable electrical/data signals to flow to/from the chip of an overmolded package 1a-1e. Thus, each of the chip packages 1a-1e can be soldered 14 to a transverse PCB 40, 50, 50a, via interconnects 14 that are, each, directly connected (mechanically and electrically) with one of the lateral electrical conductors 5-8 of each of the chip packages.

Such interconnects can notably be solders, as assumed in the following, for the sake of exemplification. Solders provide a simple and practical way to laterally connect the packages to the PCBs. However, any other suitable means such as electrical adhesive, sintered silver or copper, etc., may also be contemplated.

Figure 1B:
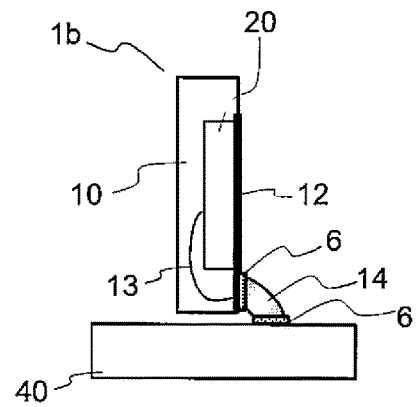
Figure 1C:
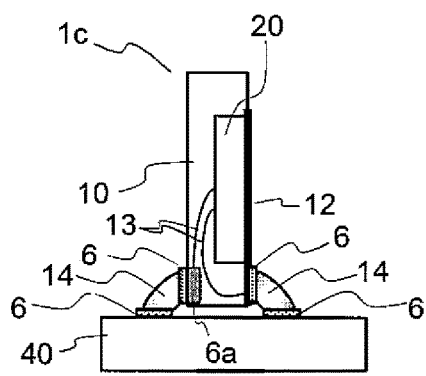

Referring to FIGS. 1B, 1C, and 9, the lateral electrical conductors 5-8 of the chip packages 1b, 1c may, in embodiments, comprise one or more rows 3, 4 of solder pads 6. In this document, a solder pad means any kind of local contact, or connection point, suitable for later soldering, i.e., to enable electrical/data signals to flow to/from an IC chip or a PCB via a solder joint, which, in turn, connects to another electronic component or PCB.

As discussed in more detail below, edge solder pads may notably be formed from blind holes or through holes (i.e., vias), arranged on a main surface of the packages 1b, 1c. Owing to the preferred fabrication processes discussed herein, each edge solder pad will be located directly on a lateral edge LE, so as to be bordered partly by the main surface MS (on which it is primarily defined) and partly by an adjoining lateral surface LS of the package 1b, 1c (FIGS. 1B, 1C). As a result, each solder pad "interrupts" the lateral edge and the adjoining lateral surface in that case.

In less-preferred variants (FIGS. 1 A, 7), thin holes may be drilled directly from a lateral surface LS of the package 1a. In such a case, the resulting solder pads would line up along a lateral surface, without necessarily touching (i.e., interrupting) the contiguous lateral edges. Such solder pads are, however, more difficult to fabricate in practice. Other connecting elements 5a, 6a may be provided, e.g., to connect to embedded wires 13, if necessary.

Figure 7:
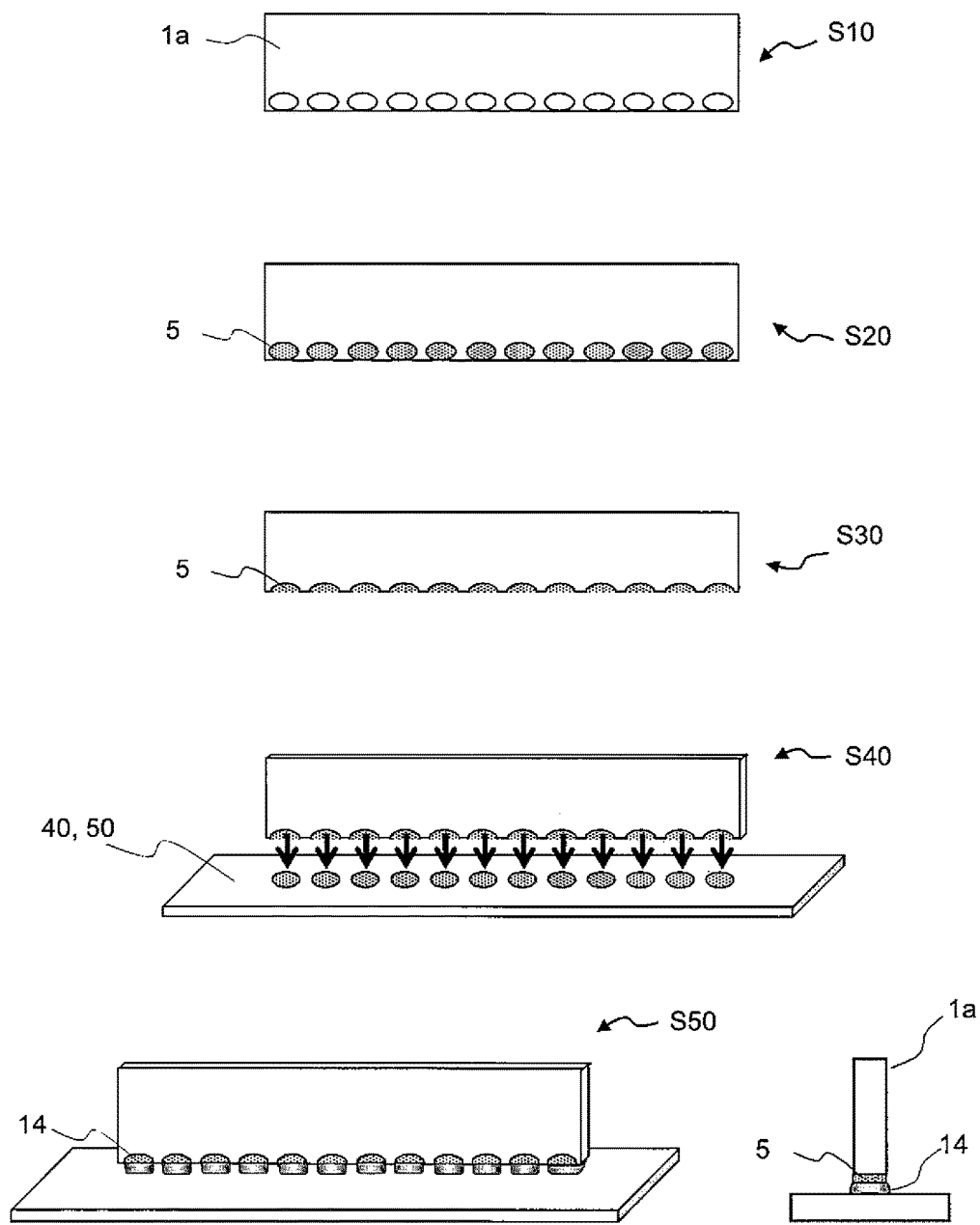
FIGS. 7 and 8 illustrate high-level fabrication steps of IC chip package assemblies and their lateral soldering to a base board, according to embodiments. The fabrication methods depicted in FIGS. 7 and 8 involve solder pads fabricated as through holes and blind holes, respectively.
Figure 8:
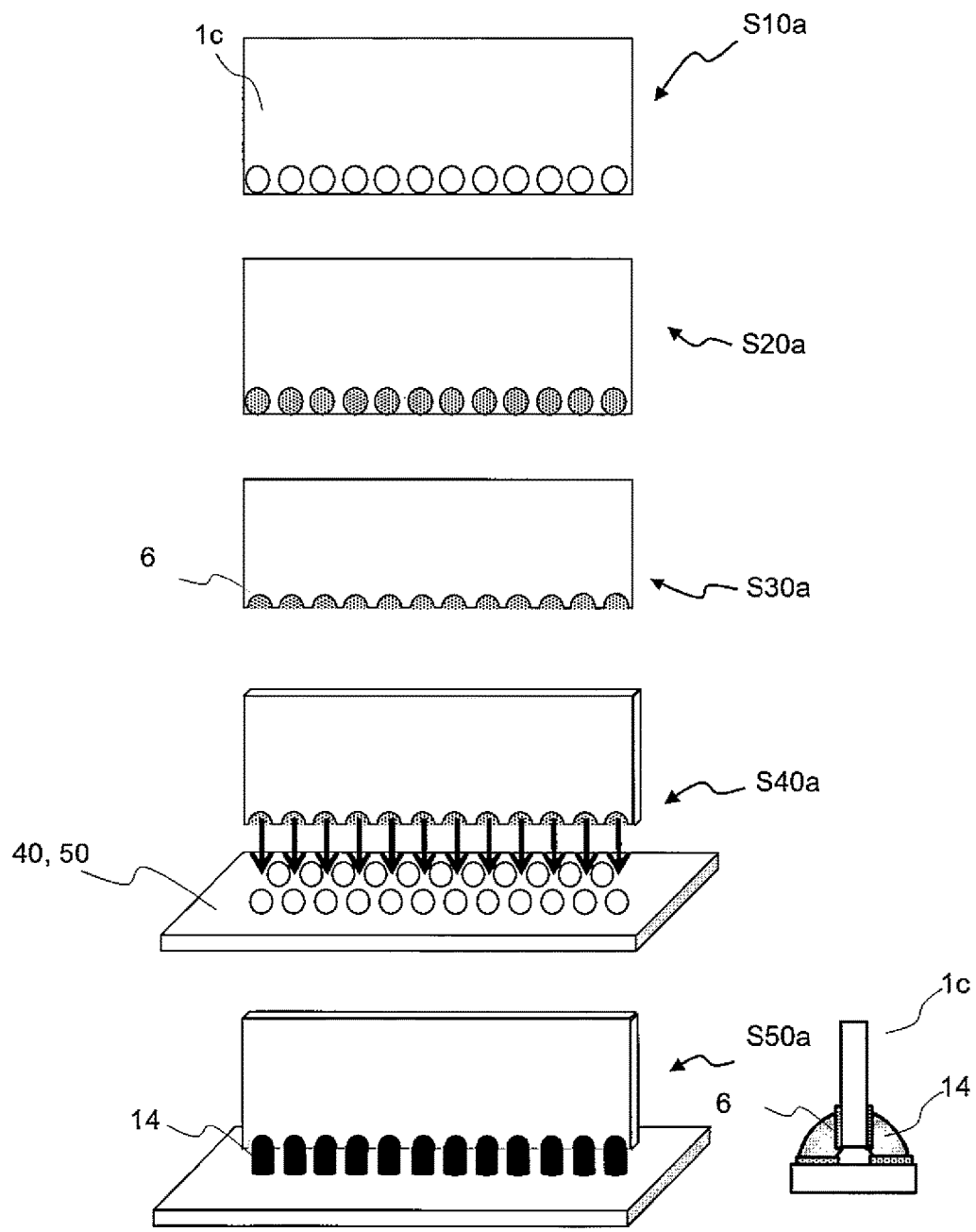

Referring now more particularly to FIGS. 7-9, solder pads 5, 6 may, in embodiments, be formed from a blind hole or a through hole, provided on a main surface of the PCB and cut open (typically in half), at the level of a lateral surface LS. For instance, the embodiment of FIG. 9 shows two rows 3, 4 of solder pads 6 (not finalized yet). The rows extend along opposite edges LE, with each solder pad 6 formed as blind holes, cut at the level of the front lateral surface LS. Here, each hole 6 interrupts a lateral edge (as well as the adjoining lateral surface in that case). The plating material is not depicted in FIG. 9. Yet, each hole 6 depicted in FIG. 9 is meant to be later plated with an electrically conductive material, to form a plated blind hole.

This is illustrated in FIG. 8: blind holes used to form the edge solder pads are plated with an electrically conductive material, to complete the fabrication of the solder pads 6. In variants such as illustrated in FIG. 1A or 7, solder pads are initially formed as through holes, which are then filled with an electrically conductive material, so as to enable an electrical connection from a lower, lateral surface of the overmolded package 1a. Using blind holes (FIG. 8), however, makes it possible to provide pads on two sides of the PCB and hence to potentially double the connection density, as illustrated in FIGS. 1C, 2A and 8.

In the class of embodiments subtended by FIGS. 1A, 1D, 1E, 2B, 2C and 7, the chip packages 1a, 1d, 1e comprise, each, lateral electrical conductors 5, 7, 8 that are formed directly on one of the lateral surfaces LS of the chip packages. Such lateral electrical conductors may be formed as solder pads 5, as discussed above. Yet, other embodiments can be contemplated, which provide additional advantages, as discussed now in reference to FIGS. 1D, 1E, 2B and 2C.

Figure 1D:
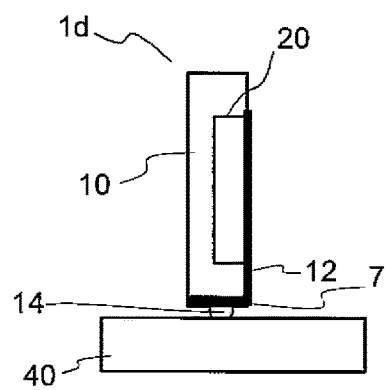
Figure 2B:
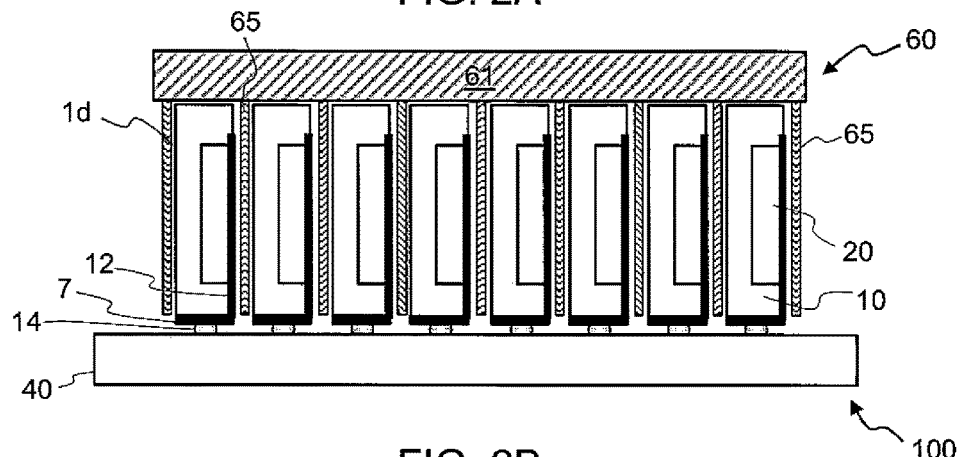
Figure 3:
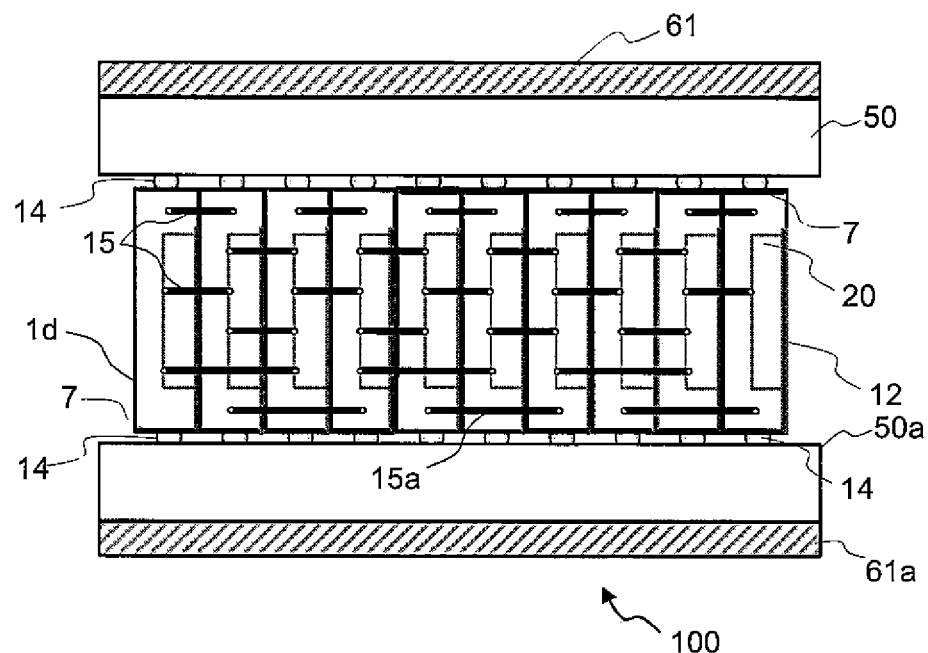
FIGS. 3 and 5 show top views of IC chip package assemblies, according to other embodiments.

For example, in the embodiments of FIGS. 1D, 2B and 3, the packages 1d involve conductors that are laterally patterned as laser bus lines 7. The assembly 100 depicted in FIG. 2B can be obtained thanks to fabrication method steps that are individually known per se. For instance, the chips may be overmolded on top and wired 12 from below. Then, the packages can be singulated and glued to form a stack. The side walls may need be grinded, to expose the wires and dies. Intermediate thermal dissipation layers 65 may be inserted in the stack, if necessary, as assumed in FIG. 2B (the adhesive material is not shown in FIG. 2B, for conciseness). Next, side walls 7 can be coated and patterned (laser bus lines, to form wiring or pads). Finally, a solder stop is applied, the lateral conductors 7 are soldered 14 to the board 40 and a heat spreader 61 is affixed to the stack. A thermal interface material may be needed (not shown), between walls of the chip packages and parts 61, 65 of the thermal dissipation structure. Bus lines are preferably formed by laser ablation but could also be patterned by other means, e.g., by electroplating.

Figure 1E:
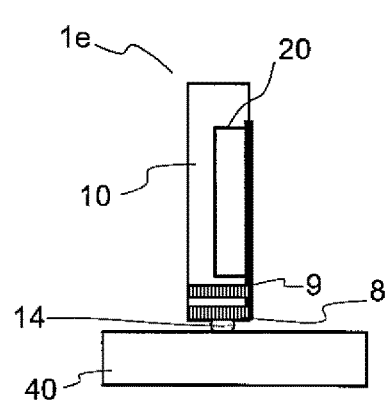
Figure 2C:
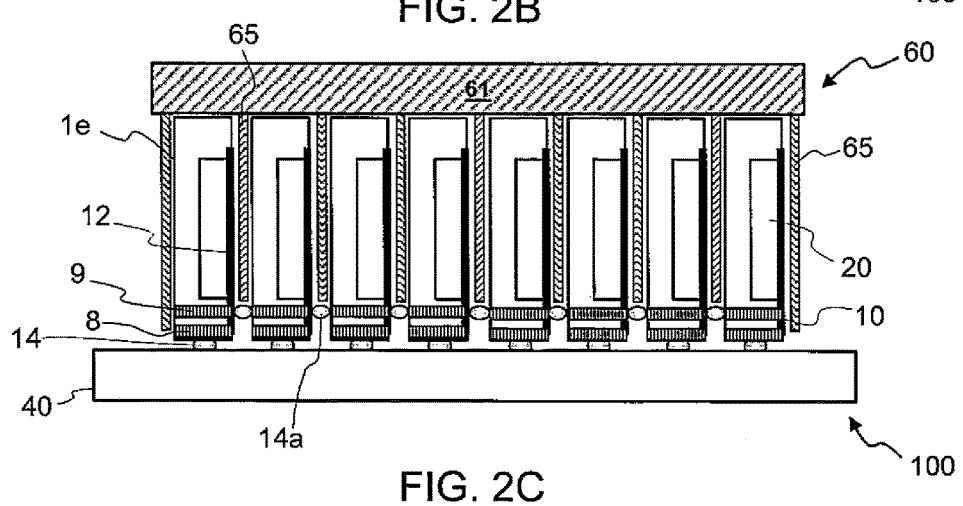

In variants, such as depicted in FIGS. 1E and 2C, the lateral electrical conductors of the chip packages 1e may be obtained in the form of exposed through mold vias (TMVs) 8, where the exposed TMVs extend transversely to an average plane of their respective chip package 1e.

In addition, and as further depicted in FIG. 2C or 3, IC chips of the packages may directly connect to other chips of the stack of chip packages. This can be achieved thanks to one or more additional TMVs 9, which extend through the overmold of the chip packages 1e, FIG. 2C. Additional bus lines 15, 15a may be used as well, as seen in FIG. 3, where some 15 of the bus lines connect contiguous chip packages whereas longer lines 15a may be provided to connect distant packages 1d. The additional bus lines 15, 15a and the lateral bus lines 7 are preferably patterned on distinct lateral surfaces of the chip packages, to optimize the available space. The chip packages 1d appearing in FIG. 3 are essentially similar to the package of FIG. 1D, except that they can be soldered from two opposite lateral sides. Bus lines may be used in addition to, or in lieu of TMVs. Note that solder pads may be used too, which can be appropriately connected by any suited interconnects to achieve the same. More generally, TMVs, bus lines and solder pads can be used to fabricate lateral conductors and/or to connect chips of the stack of chip packages directly through the stack. TMVs and bus lines are typically made of copper.

The assembly 100 depicted in FIG. 2C can be obtained as follows. Chips are first overmolded and wired, as before. Then, TMVs 8, 9 are provided, transversely to the packages 1e, which TMVs 8, 9 connect to the wires 12 of their respective, overmolded package 1e. Next, the packages are singulated, the TMVs 9 are soldered 14a, an underfill material is added (not shown in FIG. 2C) and the dies are stacked. Side walls of the stack are then grinded, to expose the TMVs 8 and dies. As before, intermediate thermal dissipation layers 65 may be inserted in the stack. Finally, a solder stop is applied, the lateral conductors (TMVs 8) are soldered 14 to the board 40. A thermal interface material may again be needed.

Incidentally, additional chip packages (each comprising an overmolded chip) may be provided, between two laterally soldered chip packages. The additional IC packages need not necessarily be edge/laterally soldered onto transverse PCB (s). Yet, they are typically connected directly through the stack of chip packages in that case. I.e., 4, intermediate packages may electrically connect to a neighboring package via bus lines (such as lines 15, 15a in FIG. 3) or TMVs (such as TMVs 9 in FIG. 2C).

In embodiments such as depicted in FIG. 5 or 6, signal communications between the chips 20 of the IC packages 1b are solely ensured via the edge solders 14, which connect edge solder pads of the packages 1b to the boards 50, 50a, contrary to the embodiments of FIGS. 2C-4. Yet, only one side board 50 may be used, instead of two as depicted in FIGS. 3 and 5.

Increasing the package density may pose additional problems in terms of heat dissipation. Therefore, and as evoked earlier, the present IC package assemblies 100 may, in embodiments, include a heat dissipating structure 60, 60a, as illustrated in FIGS. 2-6. The latter may notably include thermally conducting layers or plates 65, intercalated between two IC packages of the assembly 100, as seen in FIG. 2. The thermally conducting layers may for instance be plates, layers, foils or flexible foils (preferably comprising copper). The heat dissipation structure shown in FIG. 2 can be regarded as a comb structure with IC packages inserted between teeth 65 of the comb. The teeth are connected to a base structure 61, i.e., a plate or heat spreader, which itself typically connects to a heat sink, not shown here. The plate 61 extends parallel to the stacking direction of the stack. Several structural arrangements can be contemplated. Such heat dissipation structures allow to satisfactorily dissipate heat in high-density package assemblies 100 as proposed herein. Still, the overmold material used for the chip packages may already provide a satisfactory thermal conduction, such that a comb structure may not be necessary. This may especially be the case if the filler material of the overmolds comprises alumina particles, instead of silica particles, and possibly at higher fill fractions.

Note that, in the embodiments of FIG. 2C, intermediate layers 65 are made shorter than the outer structures 65, to allow inter-chip communication, e.g., via TMVs 9. Similarly, narrower intermediate layers 65 may be used in the embodiment of FIG. 2C, to allow additional bus lines 15 as in FIG. 3.

In variants, the heat dissipation structure 60, 60a may only comprise one or more heat spreaders 61, 61a, arranged laterally, and transversely to the stack of chip packages, as depicted in FIGS. 3 and 4. A single, lateral heat spreader may also be used in the embodiments of FIG. 2, it being reminded that the heat conduction properties of the overmolded material 10 may already be sufficient to ensure satisfactory heat dissipation.

Referring now to FIGS. 7, 8, according to another aspect, the invention can be embodied as a method of fabrication of an IC package assembly such as discussed before. Basically, this method revolves around providing S30, S30a chip packages 1a-1e and one or more PCBs, then laterally soldering S40, S40a each of the chip packages to one of said one or more PCBs, so as to obtain a stack of chip packages that are, each, laterally soldered to each of one or more transverse PCBs, as described earlier.

The present fabrication methods may notably comprise prior steps of fabrication, wherein e.g., lateral electrical conductors 5-8 are formed S10-S30, S10a-S30a along a lateral edge of the chip packages, e.g., on a lateral surface thereof, consistently with aspects already described earlier, notably in reference to FIGS. 2B and 2C. As seen above, the lateral conductors 5-8 may involve solder pads, exposed TMVs and/or bus lines. The interconnects can then be used to connect the chip packages to transverse PCBs can involve solder, electrical adhesives and/or sintered silver or copper. So, many electrical interconnect options are possible.

Additional aspects of the fabrication of chip packages 1a-1c (comprising lateral solder pads) used in IC chip assemblies depicted in FIGS. 2A, 5 and 6, are now described in detail, and in reference to FIGS. 7 and 8.

Assume that an overmolded chip package is provided S10, S10a, which already includes IC chips, as well as all necessary electrical wires 12, 13 to connect them. Then, a row of solder pads 5, 6 can be fabricated S10-S30, S10a-S30a along a lateral edge of the chip packages. In embodiment, these fabrication steps ensure that each solder pad 5, 6 is formed directly at a lateral edge or directly on a lateral surface, according to specifications described earlier.

As illustrated in FIGS. 7, 8, the fabrication may be carried out as follows. First, a row of holes is fabricated S10-S20, S10a-S20a on one (or each) of the two main surfaces of a chip package, so as for this row to extend along an initial, lateral edge of the chip package. Second, the chip package is cut S30, S30a along the initial lateral edge (a new lateral edge and a new surface are accordingly obtained), so as for each hole to be cut open at the level of the new lateral surface (typically in half). The new lateral surface is that surface that meets one of the two main surfaces of the chip package at the level of the new lateral edge as obtained after cutting.

In the specific embodiment of FIG. 7, through holes are drilled S10 and then filled S20 with an electrically conducting material to obtain temporary pads 5. Note that it may not be necessary to fully fill the through holes. It may for instance be enough to have them plated, provided that the solder used to generate the solder joint (e.g., on a mainboard) is suited for establishing a contact between the plated materials and the solder pads (e.g., on the mainboard). Steps S10 and S20 are advantageously performed prior to cutting S30, which facilitates the fabrication, while leading to clean lateral edges and lateral surface. Still, the filling S20 may be substituted with large solder balls, so step S30 is optional.

In FIG. 8, blind holes are drilled S10a and then plated S20a with an electrically conducting material, prior to cutting S30. Temporary pads are obtained at the lower lateral edges. As evoked earlier, the steps of drilling and plating may be carried out on each of the two main surfaces of the chip package, to obtain two rows 3, 4 of solder pads 6 in fine. Yet, blind holes may be used even where only a one-sided connection is contemplated.

In each case, the solder pads finally obtained are formed directly at a lateral edge or on the adjoining lateral surface, so as for the solder pads to interrupt the lateral edge and/or the adjoining lateral surface.

Finally, chip packages may be mounted in the assembly 100. The chip packages are preferably mounted in vis-à-vis (see step S40, S40a in FIGS. 7, 8, where only one chip package is depicted, for conciseness), i.e., so as for a main surface of one chip package to be parallel to and facing a main surface of a neighboring chip package. Finally, each chip package is edge soldered S50, S50a to a same board via a respective row of edge solder pads 5, 6.

The above embodiments have been succinctly described in reference to the accompanying drawings and may accommodate a number of variants. Several combinations of the above features may be contemplated. Examples are given in the next section.

2. Specific Embodiments/Technical Implementation Details

The present concepts of chip packages and assemblies make use of an edge/lateral soldering technique, which allows a substantial increase of IC density. These concepts will notably find applications for memory packages and assemblies. In particular, the present PCBs can be used with any memory or storage components, e.g., DRAM, Flash, PCB, etc. The high-density arrangements disclosed herein may notably be used in 3D memory bar arrangements. More generally, any IC chip may be contemplated to produce chip packages assemblies according to embodiments.

Several arrangement options are possible, as illustrated in the accompanying drawings. Chip packages can be horizontally or vertically stacked. Still, they are systematically laterally soldered to a transverse PCB, to gain density. Embodiments disclosed herein leverage inter-chip TMV or bus line technology (as in FIG. 2C and 3, 4) to reduce the number of solder-balls.

Present designs may furthermore closely integrate heat dissipation structures 60, 60a. In particular, comb structures may be used with intercalated copper plates or copper-foils, for heat dissipation. Yet, thermally conductive overmolds may be used, such that a comb structure may not be necessary.

In particular, FIG. 2A shows an IC package assembly where the solder joints 14 efficiently use two rows of blind holes on each package 1c, whereas FIGS. 2B and 2C involves packages soldered from their lower, lateral sides (respectively via laser bus lines 7 and exposed TMVs 8). A comb-like, heat dissipating structure 60 has plates 65 intercalated between each of the packages 1c-e, which plates further improve the mechanical stability. A two-side baseboard 40 is used (not shown in FIGS. 2B-2C), which allows additional components 70, 80 such as a memory controller and an interface controller to be mounted on the other side of the board 40.

In FIGS. 3 and 4, memory chip packages 1b are edge soldered to side boards 50, 50a (one of the two side boards is optional), and are further connected to one another via bus lines 15. This embodiment includes thick side copper plates 61, 61a, mounted onto outer sides of the side board(s) 50, 50a, as no heat spreader directly covering the packages 1, 2 can be used here. The data signals of the memory chips of the packages 1b may for instance be directly connected to the side board(s) 50, 50a, whereas the address signals may be printed in the bus lines 15, 15a.

In FIGS. 5 and 6, several memory chips are mounted on a daughter PCB board. The small daughter PCB board(s) are edge soldered to side boards 50, 50a (one of which is optional). Signal connections can accordingly be done on both sides. Copper plates are mounted on both sides of the memory bar for heat dissipation purposes.

Regarding the fabrication process, the chip packages need be fabricated before being soldered onto the base board or side boards. Components on the base board can be soldered together with the soldering of the chip packages onto the base board or side boards. Dual-temperature soldering or vapor-phase soldering methods may notably be used, amongst other methods. For instance, nickel and gold (i.e., ENIG, electroless nickel and gold) may be used to allow solder wetting and prevent solder diffusion. Yet, other interconnects can be used, as evoked earlier. Mechanical fixtures may be used during the soldering process, to maintain the packages as they are being soldered, although the heat dissipation structure may already provide the required mechanical stability, especially where using a heat dissipating comb structure. Else, one may use traditional fixation methods, such as angles, bolts, or rivets. In addition, also epoxy resin can be injected.

According to a first aspect, the present invention is embodied as an integrated circuit package assembly, or IC package assembly. The latter comprises one or more printed circuit boards, or PCBs, and a set of chip packages. Each of the chip packages comprises an overmold and an integrated circuit chip, or IC chip, which is overmolded in the overmold. The chip packages are stacked transversely to an average plane of each of the chip packages, thereby forming a stack, in which a main surface of one of the chip packages faces a main surface of another one of the chip packages of the stack. Each of the chip packages is laterally soldered to one or more of said PCBs and arranged transversally to each of said one or more PCBs, whereby an average plane of each of said one or more PCBs extends transversely to the average plane of each of the chip packages of the stack.

One or more chips, e.g., memory chips and processor chips, can be used to form the chip packages, according to embodiments. Preferably, two or more (e.g., each) of the chip packages are soldered to a same, transverse PCB, via respective lateral electrical conductors.

The present approach allows particularly dense arrangements of chip packages to be obtained. In particular, two aspects contribute to improve the density. First, using overmolded chip packages makes it possible to get rid of the carrier boards (onto which IC chips are otherwise soldered, flat, in the prior art known to the inventor). Second, the stack of overmolded chip packages are laterally soldered to a transverse PCB (or to several PCBs). I.e., the average plane of any transverse PCB is parallel to the direction of stacking of the chip packages.

For example, in embodiments, each of the chip packages comprises: two opposite main surfaces, each delimited by lateral edges; lateral surfaces, each meeting each of the two main surfaces at one of the lateral edges; and lateral electrical conductors formed along one of the lateral edges, on one of the main surfaces and/or on one of the lateral surfaces. Each of the chip packages is soldered to one or more of said one or more PCBs, via one or more electrical interconnects that are, each, in electrical contact with one of the lateral electrical conductors of said each of the chip packages. Lateral conductors ease the connection to the transverse PCB(s).

In preferred embodiments, the lateral electrical conductors comprise conductors formed on one of the lateral surfaces of said each of the chip packages. The Interconnects are in electrical contact with such conductors. The interconnects used to connect to the lateral conductors can notably be solders or any other suitable means such as electrical adhesive, sintered silver or copper, etc.

For example, the conductors formed on a lateral surface are laterally patterned as bus lines. Bus lines may for instance be formed by laser writing or by electro forming. In variants, they are obtained as exposed, through mold vias, which extend transversely (e.g., perpendicularly) to an average plane of their respective chip package.

In in this respect, the through mold vias technology can be leveraged, so that IC chips of distinct chip packages of the stack may, in embodiments, be connected to each other thanks to additional, transverse through mold vias. This further allows to lower the connection density to the transverse PCB(s).

In preferred embodiments, the chip packages comprises wires that electrically connect the lateral electrical conductors to respective IC chips. Said wires may notably comprise outer wire portions, i.e., wire portions that extend on a main surface of the chip packages, and/or wire portions that are encapsulated in the overmold of each chip package.

In embodiments, the lateral electrical conductors of one or more of the chip packages comprise a row of solder pads, the row extending along said one of the lateral edges. The edge solder pads accordingly obtained can be at least partly housed in blind or through holes, cut open at the level of a lateral surface. Higher connection density can be achieved, however, by housing edge solder pads in blind holes, as blind holes can be provided on each side of a chip package. In addition, solder pads may be formed by discontinuous bus lines, e.g., as laser bus lines.

In preferred embodiments, the IC package assembly further comprises a heat dissipating structure, in thermal communication with each of the chip packages. The heat dissipating structure may notably comprise a thermally conducting layer or plate (e.g., a heat spreader) extending parallel to a stacking direction of the stack, e.g., parallel to a transverse PCB to which the packages of the stack are laterally soldered. In embodiments, the heat dissipating structure comprises thermally conducting layers, or plates, intercalated between chip packages of the stack.

According to another aspect, the invention is embodied as a method of fabrication of an IC package assembly as described above. The method comprises: providing said set of chip packages and said one or more PCBs; and soldering each of the chip packages to one or more of said one or more PCBs, so as to obtain said stack.

In preferred embodiments, the method further comprises, prior to soldering, forming said lateral electrical conductors along said one of the lateral edges.

Preferably, forming said lateral electrical conductors comprises forming conductors on said one of the lateral surfaces of said one or more of the chip packages.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. An integrated circuit (IC) package assembly, comprising:
one or more printed circuit boards (PCBs); and
a set of chip packages, each comprising:
an overmold;
an IC chip, overmolded in the overmold;
two opposite main surfaces, each delimited by lateral edges;
lateral surfaces, each meeting each of the two main surfaces at one of the lateral edges; and
lateral electrical conductors formed along one of the lateral edges, on one of the main surfaces and/or on one of the lateral surfaces,
and wherein:
the chip packages are stacked transversely to an average plane of each of the chip packages, thereby forming a stack wherein a main surface of one of the chip packages faces a main surface of another one of the chip packages of the stack; and each of the chip packages is laterally soldered to one or more of said one or more PCBs via one or more electrical interconnects that are, each, in electrical contact with one of the lateral electrical conductors of said each of the chip packages and arranged transversally to each of said one or more PCBs, whereby an average plane of each of said one or more PCBs extends transversely to the average plane of each of the chip packages of the stack.

2. The IC package assembly according to claim 1, wherein each of the chip packages comprises lateral electrical conductors that comprise conductors formed on one of the lateral surfaces of said each of the chip packages.

3. The IC package assembly according to claim 1, wherein said conductors formed on one of the lateral surfaces are laterally formed as bus lines.

4. The IC package assembly according to claim 1, wherein the lateral electrical conductors of one or more of the chip packages comprise, each, exposed through mold vias extending transversely to an average plane of their respective chip package.

5. The IC package assembly according to claim 4, wherein an IC chip of a first chip package of the stack is electrically connected to an IC chip of a second chip package of the stack, thanks to one or more additional through mold vias, the latter extending through the overmold of said first chip package.

6. The IC package assembly according to claim 1, wherein each of the chip packages further comprises wires electrically connecting the lateral electrical conductors to an IC chip of said each of the chip packages.

7. The IC package assembly of claim 6, wherein said wires comprise wire portions that extend on one of the two main surfaces of said each of the chip packages.

8. The IC package assembly of claim 6, wherein said wires comprise wire portions that are encapsulated in the overmold of said each of the chip packages.

9. The IC package assembly according to claim 1, wherein the lateral electrical conductors of one or more of the chip packages comprise a row of solder pads, the row extending along said one of the lateral edges.

10. The IC package assembly of claim 9, wherein each solder pad of the row is formed by a blind or through hole cut open at said one of the lateral surfaces.

11. The IC package assembly of claim 10, wherein each solder pad of the row comprises a blind hole plated with an electrically conductive material on said one of the two main surfaces.

12. The IC package assembly of claim 10, wherein each solder pad of the row comprises a through hole filled with an electrically conductive material.

13. The IC package assembly of claim 1, wherein each of the chip packages comprises lateral electrical conductors that comprise two opposite rows of solder pads, the rows extending along two opposite lateral edges of a same lateral surface of each of said one or more of the chip packages.

14. The IC package assembly of claim 1, wherein the IC chip of one or more of the chip packages is a memory chip.

15. The IC package assembly of claim 1, wherein one or more of the chip packages comprise two or more IC chips, each overmolded in a respective overmold.

16. The IC package assembly of claim 1, wherein two or more of the chip packages are, each, soldered to a same one of the one or more PCBs, via respective lateral electrical conductors.

17. The IC package assembly of claim 16, wherein said same one of the one or more PCBs is a baseboard, or a sideboard or a daughterboard.

18. The IC package assembly of claim 16, wherein said stack further comprises one or more additional chip packages, each comprising an IC chip overmolded in an overmold, wherein none of the additional chip packages is soldered to said same one of the one or more PCBs.

19. The IC package assembly of claim 1, further comprising
a heat dissipating structure, in thermal communication with each of the chip packages.

20. The IC package assembly of claim 19, wherein the heat dissipating structure comprises a thermally conducting layer or plate extending parallel to a stacking direction of the stack.

21. The IC package assembly of claim 19, wherein the heat dissipating structure comprises thermally conducting layers, each intercalated between two chip packages of the stack.

22. A method of fabrication of an IC package assembly according to claim 1, the method comprising:
providing said set of chip packages and said one or more PCBs; and
soldering each of the chip packages to one or more of said one or more PCBs, so as to obtain said stack.

23. The method according to claim 22, further comprising, prior to soldering:
forming said lateral electrical conductors along said one of the lateral edges.

24. The method of claim 22, wherein each of the chip packages comprises lateral electrical conductors that comprise conductors formed on one of the lateral surfaces of said each of the chip packages, and wherein the method further comprises:
forming said lateral electrical conductors comprises forming conductors on said one of the lateral surfaces of said one or more of the chip packages.

* * * * *